United States Patent [19]

Getter

[11] Patent Number: 4,872,102
[45] Date of Patent: Oct. 3, 1989

[54] D.C. TO A.C. INVERTER HAVING IMPROVED STRUCTURE PROVIDING IMPROVED THERMAL DISSIPATION

[75] Inventor: Dennis L. Getter, Little Canada, Minn.

[73] Assignee: Dimensions Unlimited, Inc., St. Paul, Minn.

[21] Appl. No.: 856,506

[22] Filed: Apr. 28, 1986

[51] Int. Cl.[4] ........................................... H02M 7/537
[52] U.S. Cl. ................................... 363/141; 307/150; 361/383; 361/388; 363/132
[58] Field of Search ................. 363/13, 123, 131, 132, 363/141, 144; 361/379, 383, 388, 386, 399, 381, 384, 389; 336/61; 307/150, 151

[56] References Cited

U.S. PATENT DOCUMENTS

| | | | |
|---|---|---|---|
| 2,555,630 | 6/1951 | Bishner | 307/150 |
| 3,200,296 | 8/1965 | Bruestle | 361/388 |
| 3,316,454 | 4/1967 | Donath et al. | 361/389 |
| 3,790,860 | 2/1974 | Verdisco | 361/384 |
| 3,857,044 | 12/1974 | Papoi et al. | 361/383 |
| 3,909,679 | 9/1975 | Petri | 361/388 |
| 4,177,499 | 12/1979 | Volkmann | 361/383 |
| 4,365,288 | 12/1982 | Robe et al. | 363/141 |
| 4,394,706 | 7/1983 | Crafts | 363/144 |

Primary Examiner—William H. Beha, Jr.
Attorney, Agent, or Firm—Henry C. Kovar

[57] ABSTRACT

A DC to AC power inverter has an improved construction providing for substantially improved thermal disipation, reliability, and efficiency; the inverter has a unitary combination frame and heat diffuser with a pair of opposed U-shaped sections at right angles to each other and with a common base, a cover, a transformer, a primary internal heat sink inside of and on the frame, a plurality of power switches fastened on the internal heat sink, a printed circuit board fastened to and spaced from the heat sink with leads from the switches connected to the board, the transformer is fastened onto the frame in heat exchange relationship and part of the coil extends through the frame into an air passageway. All of the wiring access is on a field wiring end and the opposite end is a control end with the switches and circuit board; an improved arrangement of components and leads provides discrete separation of the high and low voltage components and leads. The inverter is extremely effective at heat disipation and has been UL tested and approved.

25 Claims, 3 Drawing Sheets

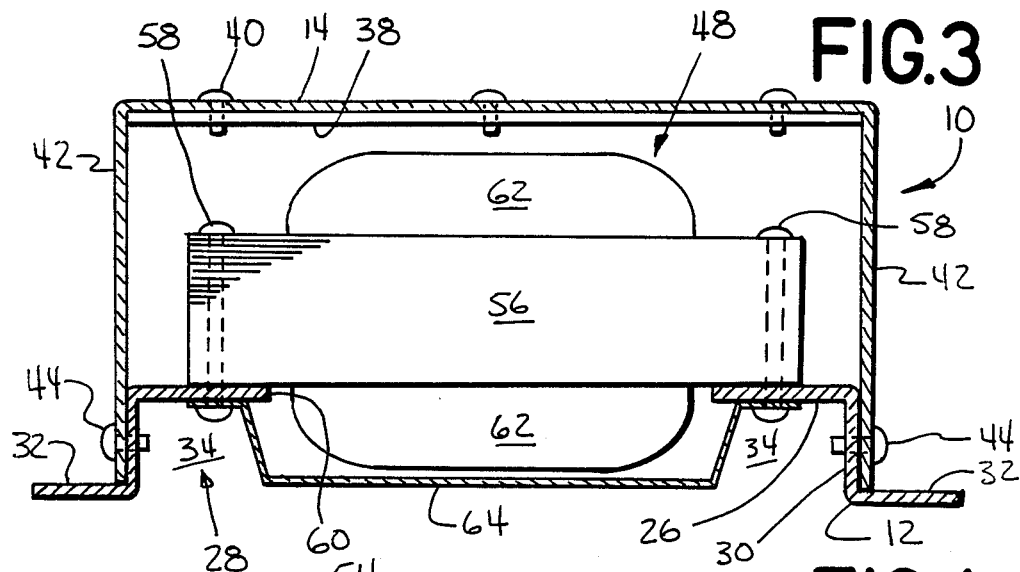
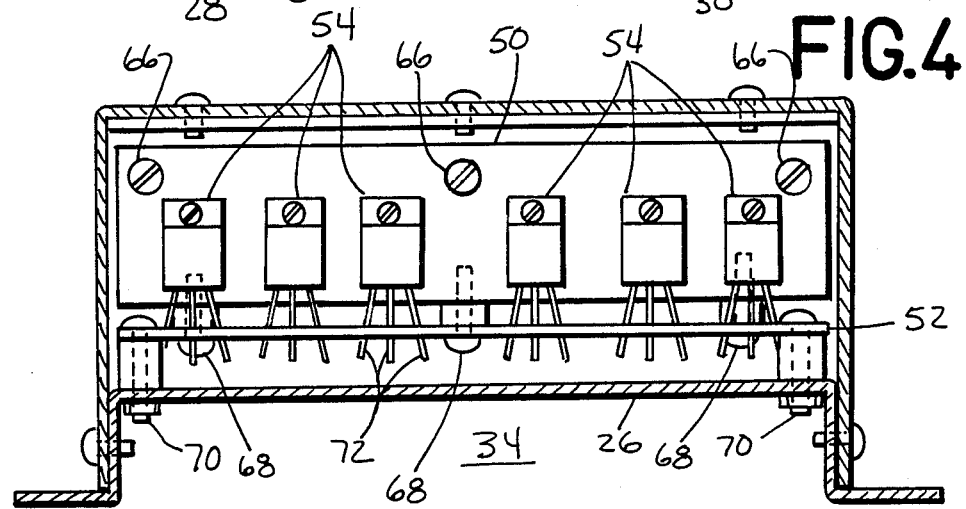
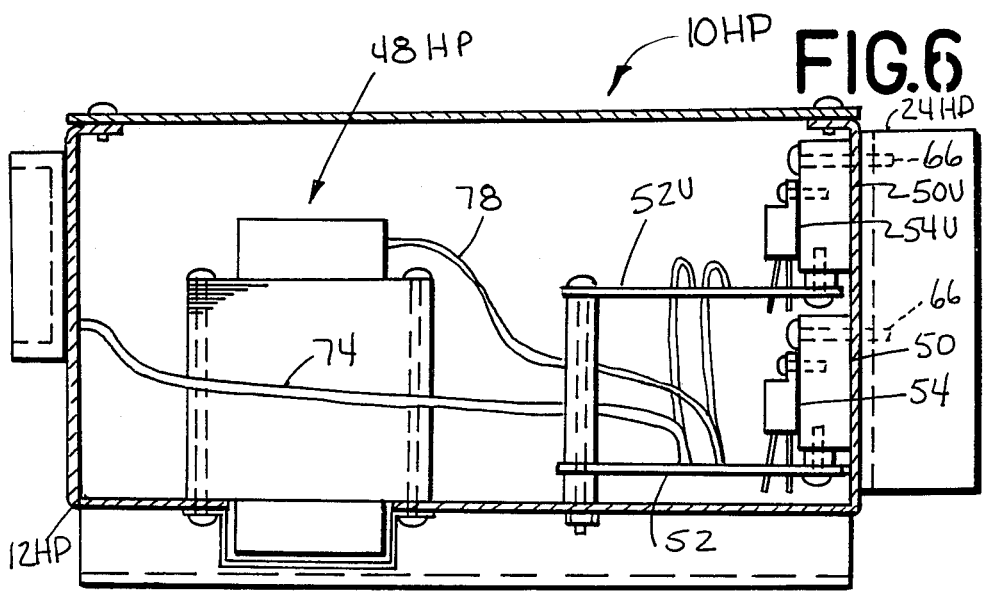

D.C. TO A.C. INVERTER HAVING IMPROVED STRUCTURE PROVIDING IMPROVED THERMAL DISSIPATION

BACKGROUND OF THE INVENTION

1. Field of the Invention

This invention pertains to an improved DC to AC inverter having an improved housing and mounting assemblies with plural diverse electrical components, providing improved thermal disipation, greater safety, and greater reliability.

2. The Prior Art

Inverter systems which convert DC to AC are of use in the motorhome, recreational vehicle (RV), farm tractor, boat, trucking, construction and other industries. The most common inverter system provides 115 volt AC power from the 12 volt DC battery system commonly found on vehicles. The inverter system is typically used to provide AC electrical power for small refrigerators, appliances, vacuum cleaners, hair dryers, televisions, radios, small AC power tools, computers, lighting systems and the like. The inverter system can replace a much costlier, larger, heavier and maintenance intensive gas engine powered generator system.

Prior art patents seem to be concentrated in:
class 307, subclasses 10, 150 and 157, and
class 363, subclasses 41, 97 and 134.

A first representative prior art patent is 4,376,250 which has a mobile inverter system on a wheeled cart with its own discrete batteries. This inverter has a chassis and construction specifically for discrete mobility. U.S. Pat. No. 4,317,165 has an improved electronic component structure providing improved efficiency and regulation of output voltage.

The big problems with inverters are heat, disipation of the heat, durability, isolation of high voltage, physical size, and liability in view of the prevailing lack of agency testing and approval.

Heat concentration and hot spots are problems. High temperature reduces the performance and shortens the life of electronic components. Persons around the inverter are presently exposed to injurious high temperatures on exterior surfaces of the inverters. Ignition of gasoline, or natural gas or LP vapors is also a problem.

Durability has been most often manifested by broken components as a consequence of the vibration and shock typically seem in over-the-road trucks and other vehicles. Component leads, components, and solder joints tend to break and/or separate.

The transformer mounts have been problems. Typically the transformer has been mounted vertically upon a sub-frame. Under impact and vibration the transformer has been one of the first things to break loose, or has bent the frame, sub-frame and/or electrical leads in the inverter.

The physical configuration of wiring, circuitry and leads in existing inverters is causing excess inductance and is responsible for relatively poor performance and premature component failure.

Isolation of high voltage AC from the low voltage DC is a problem because the leads and components are intermixed and crossed within the inverter component compartment.

The relatively large physical size of existing inverters is a detriment to their acceptance and usage, particularly in such space efficient devices as RVs, truck tractors and boats. A good part of the bulk and relatively large size is a consequence of using size and volume to distribute and disipate heat from the inverter, and to keep high and low voltage components separated.

Lack of agency approvals, specifically UL, CSA and others, is a problem which is a serious detriment to acceptance and usage of inverters. RV manufacturers and truck manufacturers and dealers will not assume or not be permitted to assume by their insurers the liabilities involved for the sale and installation of untested and unapproved electrical equipment that can cause fires, explosions, cause property damage and/or injure people.

Relatively high costs and selling prices from excessive componentry usage and manufacturing costs, have also been a detriment to the successful commercialization and usage of inverters.

Only one other inverter is known to be UL approved, and it is relatively enormous in size and does not lend itself to usage in space efficient structures.

OBJECTS OF THE INVENTION

It is an object of the present invention to provide an improved DC to AC inverter having structure providing improved thermal disipation.

It is an object of the present invention to provide an improved inverter having structure providing improved resistance to vibration and shock.

It is an object of the present invention to provide an improved inverter having a combination frame and primary heat sink with an improved mounting of the transformer, the transformer being the heaviest component in the inverter.

It is an object of the present invention to provide an improved inverter with a combination structural frame and primary heat diffuser.

It is an object of the present invention to provide an improved inverter having a transformer mounted to a combination frame and heat diffuser with the transformer being both inside of the inverter and being exposed to air flow past the inverter.

It is an object of the present invention to provide an improved inverter having internal power switches and a heat sink for the switches which is in direct thermal conductive exchange to a heat sink in ambiant air outside of the inverter.

It is an object of the present invention to provide an improved inverter having a new construction of internal printed circuit board, power switch, and discrete heat sink wherein the switch leads to the board are protected from breakage while the switches are mounted to the heat sink.

It is an object of the present invention to provide an improved inverter with a unitary combination frame and heat diffuser, with a thermal barrier between the frame and a field wiring compartment on the frame.

It is an object of the present invention to provide an improved inverter having physically separated high and low voltage leads and components.

It is an object of the present invention to provide an improved inverter that is agency approved, small in size and of such reasonable cost and price that it is commercially successful in mass markets.

SUMMARY OF THE INVENTION

According to the principles of the present invention, a DC to AC inverter with improved thermal dissipation has a combination structure frame and primary heat sink with a pair of opposed and crossed U-shaped cross sections having a common base, a cover on the frame, structure on the frame for converting DC to AC, field wiring structure on one side of the frame and a secondary heat diffuser on a different side of the frame.

A DC to AC inverter has a combination frame and primary heat diffuser, a cover over the frame, and a transformer inside the frame with the transformer laminations being mounted directly upon the frame with part of the transformer coil projecting through the frame into an air passageway in the frame.

A damage resistance DC to AC inverter has a thermally conductive frame, a cover, an internal heat sink on the frame, a printed circuit board mounted to and spaced from both of the heat sink and the frame, and transistorized power switches having their bodies mounted on the heat sink and their leads secured to the circuit board.

A DC to AC inverter has a thermally conductive frame, a cover, an internal heat sink on the frame, a secondary heat sink on an external surface of the frame, the sinks being opposite to each other and being overlapping upon each other, and semi-conductor power switches mounted inside the inverter and on the internal heat sink.

A DC to AC inverter has a unitary frame and primary heat diffuser, a cover, a transformer directly upon the frame, semi-conductor power switches on the frame, a field wiring compartment on the frame, and a thermal barrier between the frame and the inside of the wiring compartment.

A DC to AC converter has a frame, a cover, a transformer on the frame, a switching circuit and power switches on a control end of the frame, and physically discrete low voltage and high voltage leads which are physically isolated from each other.

Many other advantages, features and additional objects of the present invention will become manifest to those versed in the art upon making reference to the detailed description and accompanying drawings in which the preferred embodiment incorporating the principles of the present invention is set forth and shown by way of illustrative example.

BRIEF DESCRIPTION OF THE DRAWINGS

FIG. 3 is an elevational sectional end view through lines III—III of FIG. 2;

FIG. 4 is an elevational sectional end view through lines IV-IV of FIG. 2;

FIG. 6 is an elevational side view through a more powerful alternative embodiment of the inverter.

DESCRIPTION OF THE PREFERRED EMBODIMENT

Figure 1:
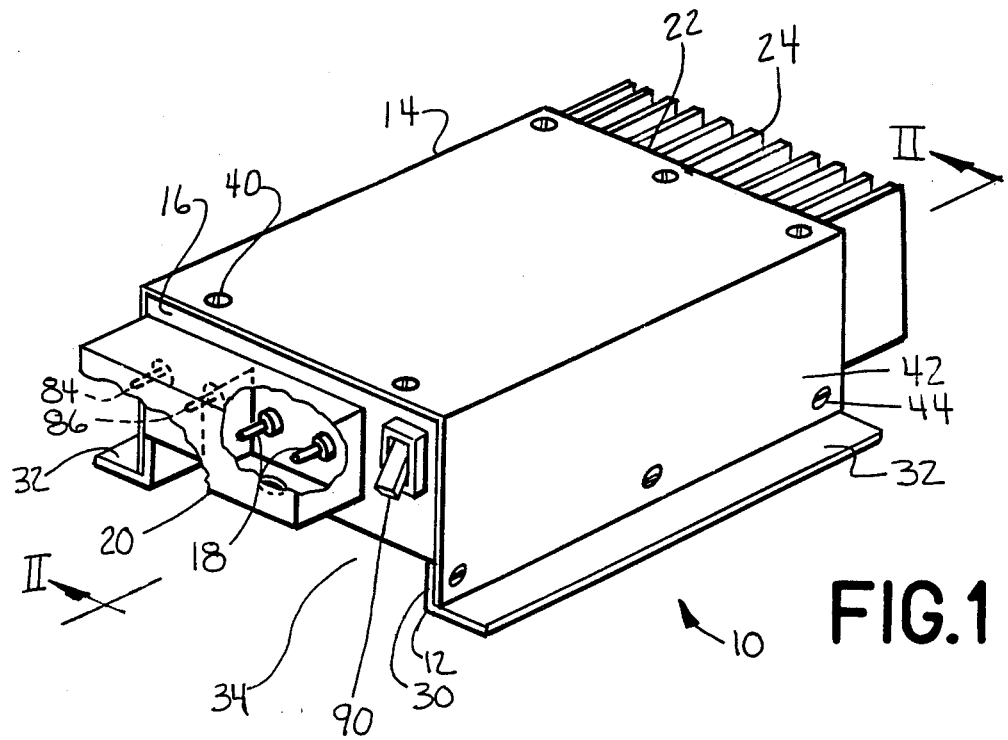
FIG. 1 is a perspective view looking downward at the top, right side and wiring end of the preferred embodiment of a DC to AC inverter according to the present invention.

According to the principles of the present invention, an inverter for converting DC electrical power to AC electrical power is shown in FIG. 1 and is generally indicated by the numeral 10.

The inverter 10 has a frame 12, a cover 14, a wiring end 16 with low voltage DC input terminals 18 and a field wiring compartment 20, and a control end 22 having an external secondary heat sink 24.

Figure 2:
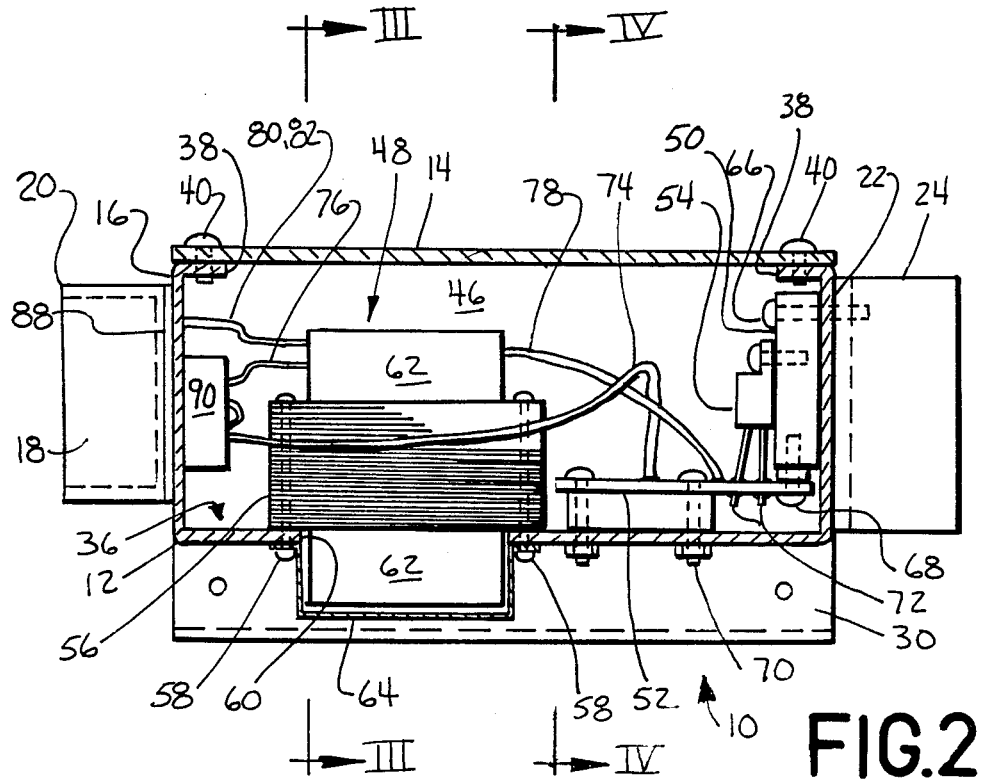
FIG. 2 is an elevational sectional side view through lines II—III of FIG. 1.

The frame 12 is a combination structural frame and component support and primary heat sink for disipation of heat from internal componentry. The frame 12 is made of quite high thermally conductive metal, a preferred material being 0.125 inch (3 mm) thick aluminum sheet. The frame 12 is a unitary contiguous member having first and second U-shaped cross-sections at generally right angles to each other and which share a common base 26. The first U-shape section, generally indicated by the numeral 28, is an inverted U-shape section 28 best shown in FIGS. 3 and 4. This U-section 28 utilizes the common base 26 in between a pair of opposed standoff legs 30. A pair of co-planar mounting flanges 32 extend outwardly from the legs 30 and form together with the inverted first U-section 28 what is commonly referred to as a hat section. Within the inverted U-section 28 is a cooling air passageway 34 which has both of its ends open. The second U-shaped section is an upright U-shaped section best shown in FIG. 2 and generally indicated by the numeral 36. The upright U-shape 36 shares the common base 26 and has its legs formed by the wiring end 16 and the opposed control end 22. Atop each of the ends 16, 22 is an inwardly turned top flange 38 to which the cover 14 is removably fastened by several fasteners 40. The cover 14 has a pair of side flanges 42 which extend down over the legs 30 and which abut against the mounting flanges 32 and which are removably fastened to the legs 30 by removable fasteners 44. The cover 14 is preferably of hardened aluminum and is held in direct thermally conductive contact against the flanges 38 and legs 30 so that the thermally conductive cover 14 will take heat from the frame 12 by conduction. Within the frame 12 and the cover 14, and specifically within the second U-shape 36 and the cover 14, is the interior component compartment 46 which is generally closed to prevent entry of dust, insects, and debris, and which prevents through flow of air. The component compartment 46 may also be sealed to prevent entry of vapors and/or rain water or spray; this depends upon the intended usage of the inverter 10.

Within the compartment 46 is a transformer 48, internal heat sink 50, printed circuit board 52 (hereinafter referred to as the PCB 52) and a plurality of power switches 54 which are metal oxide semi-conductor field effect transistors (MOSFET's). The transformer 48 is mounted with its metal laminations 56 parallel to and fastened directly against the interior surface of the frame base 26 by transformer mounting screws 58. Heat from the transformer laminations 56 is conductively passed directly into the frame 12 which is the primary heat sink and heat diffuser for the transformer 48. The frame base 26 has an aperture 60, sized larger than the transformer coil 62 and smaller than the laminations 60, through which one-half of the transformer coil 62 extends down into the cooling air passageway 34. The coil 62 may be covered by a thermally conductive metal coil cover 64 which is also fastened in direct conductive heat exchange relationship to the frame 12. The bottom of the coil cover 64 is spaced up from the mounting flanges 32 so that cooling air can flow on all surfaces of the coil cover 64. If the cover 64 doesn't need to be and isn't used, cooling air flows directly over the transformer coil 62. The transformer 48 is immediately adjacent the wiring end 16 and is spaced from the control end 22. The transformer 48 is the heaviest component in the internal component compartment 46, and is now mounted as low as possible to reduce its absolute moment and bending moment under shock and vibration, and is also mounted so that most shock and vibration loads are picked up in shear, compression and/or tension loading.

The internal primary heat sink 50 is mounted directly to the frame control end 22 as is the external secondary heat sink 24. The heat sinks 50, 24 are on opposite sides of the frame 12 from each other and are compressed together in overlapping relationship upon the control end 22 of the frame 12 by heat sink screws 66. The internal heat sink 50 is an elongate length of aluminum bar stock having an outer face fastened against the frame control end 22 and an internal face to which the power switches 54 are directly fastened. Excess and waste heat from the power switches 54 is conductively and directly transferred from the bodies of the switches 54 into the internal heat sink 50 where the heat is spread out, and then into and through the frame control end 22 and then into the secondary external heat sink 24. Part of the heat fed into the frame control end 22 is also fed into the top flange 38 and thence to the cover 14, and also into the frame base 26 and thence into the legs 30, mounting flanges 32 and cover side flanges 42. Heat is also conductively fed from the mounting flanges 32 into the structure (not shown) upon which the inverter 10 is mounted.

The PCB 52 has its outer edge mounted to a lower edge of the internal heat sink 50 by screws and non-conductive spacers 68 which also space the PCB 52 below the internal heat sink 50. The PCB 52 extends inward from the internal heat sink 50 to be adjacent to the transformer 48. The inner and side edges of the PCB 52 are fastened to the frame base 26 by more screws and spacers 70. Each of the power switches 54 has its leads 72 extending from the switch body in discrete cantilever form to the PCB 52 where the leads 72 are soldered to circuitry on the PCB 52. The PCB 52 has the complete logic and control circuitry and componentry (not shown) for control of the power switches 54 on its top side; the PCB 52 and this logic and control circuitry and componentry are all at a level below the level of the switches 54 and the internal heat sink 50 so that all heat convectively taken off of the heat sink 50 and the switches 54 rises away from the PCB 52 and its componentry. In the construction, assembly and usage of the inverter 10, the PCB 52 is firstly fastened in a fixed position with respect to the internal heat sink 50 by fasteners and spacers 68. Both of the sink 50 and PCB 52 substantially span across the width of the inverter 10 as is best shown in FIG. 4. The power switches 54 are installed in a row across the internal heat sink 50 with their leads 72 inserted into the PCB 52. The switch leads 72 are then soldered to the PCB 52. Then this assembly of heat sink 50, PCB 52 and switches 54 is placed into the frame 12 and the heat sink screws 66 are loosely installed and the PCB 52 to base 26 screws and spacers 72 are loosely installed. The latter screws and spacers 72 are in slotted, obround holes and can be adjusted. The heat sink screws 66 are then firstly tightened up and locked, and then lastly the PCB 52 to base 26 screws and spacers 72 are adjusted and tightened and locked. With this structure the switch leads 72 are held absolutely steady with respect to the power switches 54 and no breakage or other movement related failure of the switches 54 is experienced even under extreme vibration and shock. Heat from the switches 54 and transformer 48 is conductively carried away from the componentry on the PCB 52 and the operating temperatures of this componentry on the PCB 52 are minimized and the efficiency of these components maximized.

It is important that all of the MOSFET power switches 54 be kept at the same operating temperature for maximum efficiency, maximum output voltage, and for the highest reliability and in this improved construction, all of the power switches 54 are mounted in a symetrical orderly manner upon a single contiguous internal primary heat sink 50 with fairly even conductive and convective cooling and the switches 54 are kept at generally similar temperatures so that each and every one of the plurality of switches 54 switches an equal amount of current and so that each switch 54 does its fair and equal share of switching and is not overloaded.

Figure 5:
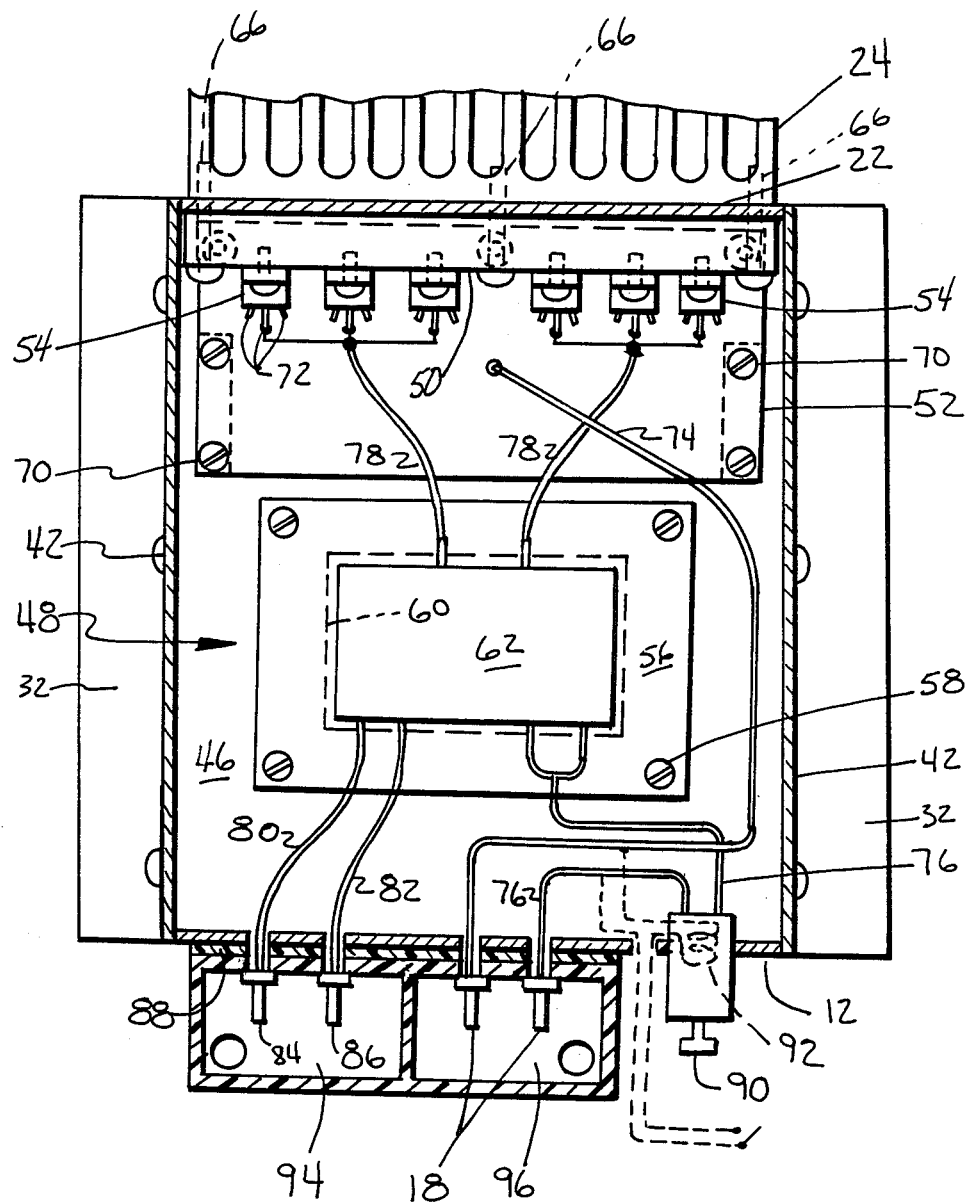
FIG. 5 is a top plan view of the structure of FIG. 1 with the cover taken off.

FIG. 5 best illustrates the division and separation of the high voltage AC leads and components from the low voltage DC components and leads. All wiring to and from the inverter 10, is on a single surface of the inverter 10, specifically it is on the wiring end 16. A first low voltage DC lead 74 extends directly from the wiring end 16 to the switching circuit on the PCB 52. A second low voltage DC lead 76 extends from the wiring end 16 to that side of the transformer 48 which faces the wiring end 16. Low voltage DC switching leads 78 extend from the side of the transformer facing the PCB 52 over the control circuitry on the PCB 52 and are connected to the PCB 52 immediately in front of the power switches 54. The PCB 52 connects each switching lead 78 in parallel to a plurality of the power switches 54. The illustrated symetry and shortness of the low voltage DC leads 74, 76, 78 is important and is very effective in preventing build up of extra and/or unwanted inductance, providing relatively high levels of electrical efficiency and protection of the solid state componentry from inductive loads.

First and second high voltage AC leads 80, 82 extend directly to the wiring end 16 from the wiring end side of the transformer 48. These AC leads 80, 82 are the only high voltage and the only AC leads in the component compartment 46. The AC leads 80, 82 come into the field wiring compartment 20 and AC connection terminals 84, 86 are inside of the field wiring compartment 20 in a discrete high voltage sub-compartment 94. The field wiring compartment 20 is preferably a phenolic di-electric box with relatively poor thermal conductivity. Regardless, there is a thermal barrier 88, which may be the non-metallic bottom of the compartment 20 or a discrete component, in between the frame wiring end 16 and the field wiring compartment 20 for minimizing thermal conductivity from the wiring end 16 into the field wiring compartment 20. This keeps the temperature in the field wiring compartment 20 at a lesser temperature than the wiring end 16. While the second low voltage DC lead 76 and the AC leads 80, 82 are both connected to the wiring end side of the transformer 48, they are connected to opposite sides of the same end of the coil 62 and are kept well spaced and discrete from each other. The DC input terminals 18 are also in the field wiring compartment 20 and are in their own discrete low voltage sub-compartment 96. Each sub-compartment 94, 96 has its own discrete wiring entrance as shown in FIG. 5.

An on-off switch 90 for the inverter 10 is mounted to the frame 12 and is disposed between the transformer 48 and the wiring end 16. The on-off switch 90 normally breaks one of the low voltage DC lines 74, 76 and in FIG. 5 the on-off switch 90 is shown in the second DC line 76. The on-off switch 90 may have a low voltage relay 92 drawing its power from the low voltage leads 74, 76. The relay enables remote control of the inverter 10 wherein the inverter 10 may be turned on or off remotely with the use of relatively safe low voltage power which can be easily and safety fused.

Thermally conductive grease is normally used between the frame 12 and the transformer 48, coil cover 64, internal heat sink 50 and the external heat sink 24 to maximize conductive heat transfer and disipation.

This improved inverter 10 has tremendously increased thermal disipation and has received UL approval after extensive testing. The power switches 54 which normally run at temperatures of up to 125/150 degrees C. are kept at temperatures of less than 60 degrees C., while these switches 54 are completely enclosed, are protected, and are inaccessable for human contact. The entire switch circuit on the PCB 52 as well as the power switches 54 is entirely 12V DC and there are no high voltages in these components. The high and low voltage components are kept discrete from each other, and the quantity of high voltage components is absolutely minimized. This inverter nominally weights twenty pounds and is rated at a continual draw of 400 watts; it will take surges of up to 1300 watts enabling it to operate small refrigerators without excessive heat rises.

The inverter 10 can be utilized as an OEM device and can be installed by RV, truck and van manufacturers because of its UL approval and because of its acceptance by insurers as an acceptable component.

The heat from the hottest componentry, which is the power switches 54, is on the opposite end from the wiring end 16. People who use the inverter 10 will need access to the wiring end 16 but not the control end 22.

All external surfaces on the inverter are kept at or below safety agency specifications so that no injury of people is possible. This has been done with a completely closed internal component compartment 46 and without the use of a cooling fan.

This inverter is a UL approved device which can be mass-marked and used by consumers without fear or trepidation.

An alternative and higher power embodiment of inverter 10 HP is shown in FIG. 6 wherein a larger transformer 48 HP is mounted on a corresponding larger but similar frame 12 HP. The same internal primary heat sink 50, PCB 52 and power switches 54 are utilized as shown. But, on top of these control components 50, 52, 54, is a second and discrete like set of upper components 50U, 52U and 54U which are substantially identical to regular level components 50, 52, 54 with the exception that the upper PCB 52U does not have the logic and control circuitry on PCB 52 because all of the power switches 54, 54U are commonly controlled by the single control circuit on the lowest PCB 52. The upper components 50U, 52U, 54U are wired in parallel to the first low voltage DC lead 74 and to the low voltage switching leads 78 to effectively double the switching capability of the inverter 10 HP. This componentry can further be triple or quadruple stacked to triple or quadruple the switching power. All of the switches 54, 54C and all of the internal primary heat sinks 50, 50U directly thermally field into the single common control end 16 HP and into a common contiguous external heat sink 24 HP. With this stacking technology, the same new and improved construction and proven componentry can quickly, effectively and reliably be extended to 750 and even 1000 watt capacities.

Although other advantages may be found and realized and various modifications may be suggested by those versed in the art, it should be understood that I wish to embody within the scope of the patent warranted hereon, all such embodiments as reasonably and properly come within the scope of my contribution to the art.

I claim as my invention:

1. An electrical DC to AC inverter having improved structure for providing improved thermal dissipation, comprising:

(a) a combination structural frame and primary heat diffuser of thermally conductive material, said frame having first and second opposed generally U-shaped cross-sections, said cross-sections being generally at right angles to each other and having a common base;

(b) a cover over the said second U-shaped section, said cover being fastened to the frame and jointly defining with the frame an internal and enclosed electrical component compartment;

(c) converting means mounted to the frame and within the component compartment for converting DC to AC, said converting means including a transformer mounted in direct heat exchange relationship to said common base;

(d) means on the outside of the inverter frame for field wiring the inverter; and (e) secondary dissipation means mounted on an exterior surface of the frame for secondarily dissipating heat from the frame, said dissipation means being spaced from said field wiring means and being on a different side of the inverter.

2. The inverter of claim 1, in which the second U-shaped section has inwardly turned top flanges on each distal end of the U-shape, said cover being an open ended U-shaped metal thermally conductive cover fastened firstly to said top flanges and secondly to legs of the first U-shaped section.

3. The inverter of claim 2, including co-planar base mounting flanges extending outward from each leg of the first U-shaped section, said cover being abutted against said mounting flanges.

4. The inverter of claim 1, in which said transformer has laminations mounted directly against the common base, and in which said converting means further includes solid state power switches mounted in thermally conductive relationship to said frame.

5. The inverter of claim 1, in which said secondary dissipation means and said field wiring means are mounted to and are on opposite legs of the second U-shaped section, said secondary means and said field wiring means projecting outwardly from the frame in opposite direction to each other.

6. The inverter of claim 1, including a cooling air pathway through the exterior of the first U-shaped section, a central aperture in the common base, and in which the transformer is mounted to the base over the aperture with one side of the transformer coil projecting through the base and aperture into the cooling air passageway.

7. An electrical DC to AC inverter having improved structure for providing improved thermal dissipation, comprising:

(a) a combination structural frame and primary heat diffuser of thermally conductive metal having an elongate U-shaped section which has a base and a pair of spaced apart legs with there being a concave side of the frame in between said legs, said concave side of said section facing outward from the base with each leg of the section having a means for mounting of the inverter, there being an open ended cooling air passageway between the legs and the mounting means;

(b) a cover over a convex side of the section, said convex side being on the opposite side of the base from the concave side, said cover and said frame jointly forming an internal electrical component compartment; and (c) converting means inside of the compartment for converting DC to AC; said converting means having (1) a transformer having its metal laminations mounted tightly against and in direct heat exchange relationship with the convex side of the base, said base having an aperture of lesser size then the laminations with one side of the transformer coil projecting through the base into the cooling air passageway within the convex side of the U-section, (2) said converting means including solid state power switches in conductive thermal communication with an upstanding first end leg on a first end of the base, (3) said transformer being adjacent a second and opposed upstanding second end on a second end of the base, said transformer being spaced from said power switches, and (4) a PCB having a control circuit thereon, said PCB being mounted to and spaced off of said base and being spaced from and being in between both the transformer and the power switches, said control circuit being electrically connected to both the transformer and the power switches.

8. The inverter of claim 7, including a thermally conductive metal transformer coil cover over and enclosing the said one side of the transformer coil, said coil cover being in direct thermal communication with the convex side of the frame base and being recessed between the distal ends of the section legs and said base, so that a cooling air flow through the passageway will pass over all of the coil cover.

9. An electrical DC to AC inverter having improved structure for providing improved thermal dissipation, comprising:

(a) a thermally conductive frame;

(b) a cover on said frame, said cover and frame jointly defining an enclosed electrical component compartment;

(c) converting means in said compartment for converting D.C. to A.C.;

(d) an internal heat sink mounted within the compartment and directly upon and in direct thermal exchange relationship with the frame;

(e) said converting means including a printed circuit board (PCB) mounted to and spaced from said frame, said PCB having circuit means thereon for controlling the functioning of the inverter;

(f) said converting means further including a plurality of transistorized power switches having their bodies mounted directly upon and in direct thermal exchange relationship the internal heat sink, said switches having leads from the bodies to the PCB, said leads being permanently secured to said PCB with the bodies being spaced from the PCB; and (g) fasteners fixedly mounting said PCB to said internal heat sink and spacers spacing the PCB from said internal sink, so that most heat from the switches is absorbed directly and conductively by the heat sink discretely away from the PCB, and so that the switch leads to the PCB are not subject to flexure, cracking and connection breakage during motion of the entire inverter.

10. The inverter of claim 9, in which a first end of the frame has means mounted on the outside of the frame for field wiring of the inverter, and in which the internal heat sink is mounted upon the inside of a second end of the frame, said first and second frame ends being opposite to each other.

11. The inverter of claim 10 in which said converting means includes a transformer mounted to and in direct thermal exchange relationship with said frame, said transformer being positioned in between said first end and said internal heat sink.

12. The inverter of claim 9, wherein said PCB is mounted to and is spaced below the bottom of the internal heat sink.

13. The inverter of claim 9, in which fasteners and spacers secure an edge of the PCB to a lower edge of the internal heat sink, said PCB and internal heat sink being at a generally right angle to each other with substantially all of the electrical circuit means on the PCB other than the power switches being longitudinally spaced from said internal heat sink.

14. The inverter of claim 9, in which said internal heat sink and said PCB substantially span the width of the inverter, with the switches being in a row across the width of the inverter.

15. The inverter of claim 9, in which the internal heat sink and switches are mounted upon and to an end of the frame, said frame end comprising an outer surface of the invention.

16. The inverter of claim 9, in which said internal heat sink comprises an elongate length of metal bar, said PCB being secured to and spaced from an edge of the bar and said switches being mounted on a first face of the bar, the bar having a second face secured directly against the frame.

17. The inverter of claim 9, in which said internal heat sink comprises an elongate length of metal bar, said PCB being secured to and spaced from an edge of the bar and said switches being mounted on a first face of the bar, the bar having a second face secured directly against the frame.

18. The inverter of claim 9, including a second such PCB, a second such discrete plurality of transistorized switches, and a second such internal heat sink, said such second components being mounted above said first said component with both of said internal heat sinks being in direct thermal exchange relationship with a single said frame.

19. An electrical DC to AC inverter having improved structure for providing improved thermal disipation, comprising:

(a) a thermally conductive and structurally self sufficient frame;

(b) a cover on said frame, said cover and frame jointly defining an enclosed electrical component compartment;

(c) converting means within said compartment for converting DC to AC;

(d) an internal primary heat sink mounted directly upon and in direct thermal exchange relationship with an internal surfaces of the frame;

(e) a secondary heat sink mounted directly upon and in direct thermal exchange relationship with an external surface of the frame, said primary and secondary heat sinks being opposite to each other and substantially overlapping each other;

(f) said converting means including semi-conductor power switches in the component enclosure, said switches being mounted directly upon and in direct thermal exchange relationship with the primary heat sink; and including (g) a printed circuit board mounted to and spaced from said primary heat sink, said power switches having leads extending to and secured to said PCB.

20. The inverter of claim 19, in which said primary heat sink is an elongate bar having an edge secured to the PCB, a face in direct thermally conductive contact with the frame, and in which the switches are on an opposite face.

21. The inverter of claim 19, in which an edge of the PCB is mounted to an edge of the primary heat sink, said PCB and said primary heat sink being at a generally right angle to each other.

22. The inverter of claim 21, in which said converting means includes discrete electrical inverter control componentry on said PCB, said componentry being longitudinally spaced from and being lower than said primary heat sink and switches.

23. The inverter of claim 19, including field wiring structure on said inverter on the outside of an opposite end of the inverter from the primary and secondary heat sink, and in which the converting means includes a transformer mounted to the frame in between the primary heat sink and the field wiring structure.

24. The inverter of claim 19, including a second and discrete such internal primary heat sink, and semiconductor power switches, both of said primary heat sinks being overlapped upon and being in conductive thermal relationship to a singular said secondary heat sink.

25. An electrical DC to AC inverter having improved structure for providing improved thermal disipation, comprising:

(a) a unitary combination frame and heat diffuser of thermally conductive metal;

(b) a cover on said frame, said cover and frame jointly defining an enclosed electrical component compartment;

(c) converting means in said compartment for converting DC to AC, said converting means including (1) a transformer in said compartment, the laminations of said transformer being mounted directly upon and in direct heat exchange relationship with said frame, and (2) semi conductor power switches in the component enclosure and in conductive thermal exchange relationship with said frame;

(d) a field wiring compartment mounted to an outside surface of said frame; and (e) a thermal barrier between the interior of said wiring compartment and said frame, said barrier comprising a non-metallic floor in the wiring compartment for keeping the field wiring compartment temperature below the frame temperature while still fastening the field wiring compartment directly to the frame;

(f) a heat sink inside of the compartment for conducting waste heat from the switches to the frame; and (g) in which said power switches and heat sink are on an opposite end of the frame from the field wiring compartment.

* * * * *